United States Patent
Rando et al.

(10) Patent No.: US 12,422,501 B2
(45) Date of Patent: Sep. 23, 2025

(54) ELECTRICAL SYSTEM WITH A CAPACITOR ELEMENT AND METHOD FOR MONITORING AT LEAST ONE CAPACITOR ELEMENT IN AN ELECTRICAL SYSTEM

(71) Applicant: TDK Electronics AG, Munich (DE)

(72) Inventors: Enrique Rando, Málaga (ES); Fernando Rodriguez, Málaga (ES); Daniel Montiel, Málaga (ES); David Peláez, Torremolinos (ES)

(73) Assignee: TDK ELECTRONICS AG, Munich (DE)

( * ) Notice: Subject to any disclaimer, the term of this patent is extended or adjusted under 35 U.S.C. 154(b) by 192 days.

(21) Appl. No.: 18/248,118

(22) PCT Filed: Oct. 8, 2021

(86) PCT No.: PCT/EP2021/077878
§ 371 (c)(1),
(2) Date: Apr. 6, 2023

(87) PCT Pub. No.: WO2022/074205
PCT Pub. Date: Apr. 14, 2022

(65) Prior Publication Data
US 2024/0003988 A1    Jan. 4, 2024

(30) Foreign Application Priority Data

Oct. 8, 2020   (EP) .................................. 20382892
Oct. 21, 2020  (EP) .................................. 20382917

(51) Int. Cl.
*G01R 31/64*  (2020.01)
*G01K 1/14*   (2021.01)

(52) U.S. Cl.
CPC .............. *G01R 31/64* (2020.01); *G01K 1/14* (2013.01)

(58) Field of Classification Search
CPC ............. G01R 31/64; G01K 1/14; G01D 3/08
See application file for complete search history.

(56) References Cited

U.S. PATENT DOCUMENTS

| | | | |
|---|---|---|---|
| 2014/0114592 A1* | 4/2014 | Eilertsen | G01R 31/64 702/58 |
| 2014/0294045 A1* | 10/2014 | Hironaka | H01G 9/008 374/142 |
| 2019/0273374 A1* | 9/2019 | Burnett | H02M 7/003 |

FOREIGN PATENT DOCUMENTS

| | | |
|---|---|---|
| DE | 102004035723 A1 | 2/2006 |
| EP | 3109648 A1 | 12/2016 |

(Continued)

OTHER PUBLICATIONS

Notice of Reasons for Refusal issued in corresponding Japanese Patent Application No. 2023-521501 dated Apr. 3, 2024, with English overview, 26 pages.

(Continued)

*Primary Examiner* — Feba Pothen
(74) *Attorney, Agent, or Firm* — MH2 Technology Law Group LLP

(57) ABSTRACT

Embodiments of the present invention are related to an electrical system with a capacitor element and to a method for operating at least one capacitor element in an electrical system, wherein at least one sensor is configured to measure at least one parameter chosen from device parameters and environmental parameters, a processing unit is configured to process the at least one parameter and to evaluate a capacitor element information of the at least one capacitor element based on the at least one parameter, and wherein the capacitor element information includes one or more chosen from a capacitance loss, a tangent variation, a stress, a remaining lifetime, a failure condition, and wherein the at least one sensor includes one or more sensors configured to measure (Continued)

one or more gas species that are chosen from gas species that can be created during a pyrolysis event of one or more components of the capacitor element.

13 Claims, 1 Drawing Sheet

(56) References Cited

FOREIGN PATENT DOCUMENTS

| | | |
|---|---|---|
| JP | S53012022 A | 2/1978 |
| JP | H05056629 A | 3/1993 |
| JP | H09065528 A | 3/1997 |
| JP | 2001332438 A | 11/2001 |
| JP | 2002373813 A | 12/2002 |

OTHER PUBLICATIONS

International Search Report and Written Opinion dated Jan. 10, 2022, PCT Application No. PCT/EP2021/077878, 12 pages.
Venet, P. et al., "Realization of a Smart Electrolytic Capacitor Circuit", IEEE Industry Applications Magazine., Jan. 1, 2002, pp. 16-20, vol. 8, No. 1, XP055649612, US; ISSN: 1077-2618, DOI: 10.1109/2943.974353.

* cited by examiner

ELECTRICAL SYSTEM WITH A CAPACITOR ELEMENT AND METHOD FOR MONITORING AT LEAST ONE CAPACITOR ELEMENT IN AN ELECTRICAL SYSTEM

CROSS-REFERENCE TO RELATED APPLICATIONS

The present application is the national stage entry of International Patent Application No. PCT/EP2021/077878, filed on Oct. 8, 2021, and published as WO 2022/074205 A1 on Apr. 14, 2022, which claims the benefit of priority of European Patent Application Nos. 20382892.6, filed on Oct. 8, 2020, and 20382917.1, filed Oct. 21, 2020, the disclosures of all of which are incorporated by reference herein in their entireties.

FIELD OF THE INVENTION

Electrical system with a capacitor element and method for monitoring at least one capacitor element in an electrical system Embodiments of the present invention are related to an electrical system with a capacitor element and to a method for operating at least one capacitor element in an electrical system.

BACKGROUND OF THE INVENTION

Capacitors like, for example, film capacitors or aluminum capacitors are widely used in numerous applications. For example, converters that are used to adjust electrical supply signals to the required parameters of electrical appliances contain such capacitor elements as fundamental components, which are required to function properly. However, film capacitors can be exposed to the risk of experiencing premature aging, for example due to insulation resistance damage, which can result in pyrolysis processes of the dielectric polymer used in the capacitor. Due to the pyrolysis process, flammable gases can be produced due to a decomposition of the polymer material. In case the housing of the capacitor is leaking, such gases can escape into the environment. Consequently, there will be a risk of an explosion when these gases are released. Aging can be caused by a combination of environmental and operation conditions which can in several ways affect different degradation mechanism as, for example, self-healing, electrochemical corrosion or mechanical degradation.

Up to today, the main solution for preventing an unexpected failure of a capacitor is a measurement of the capacitance and loss factor and the comparison of these parameters to previous measurements, as well as visual inspection. Usually, prior to the measurement and inspection a disconnection from the power circuit is necessary.

At least one object of particular embodiments is to provide an electrical system with at least one capacitor element. At least one further object of particular embodiments is to provide a method for monitoring at least one capacitor element in an electrical system.

These objects are achieved by a subject-matter and a method according to the independent claims. Advantageous embodiments and developments of the subject-matter and the method are characterized in the dependent claims, and are also disclosed by the following description and the drawings.

SUMMARY OF THE INVENTION

According to at least one embodiment an electrical system comprises at least one capacitor element. The capacitor element can also be denoted in short as capacitor in the following, and can be, for instance, a film capacitor. Typically, a film capacitor comprises a dielectric polymer film, which is provided with electrodes. The electrodes of film capacitors may be metallized aluminum or zinc applied directly to the surface of the polymer film, or a separate metallic foil. To form a capacitor body, two of these conductive layers can be wound into a cylinder shaped winding or can be layered as multiple single layers stacked together. Furthermore, the capacitor element can be another type of capacitor as, for instance, an aluminum electrolyte capacitor. Moreover, the electrical system can comprises a plurality of capacitor elements, wherein the following description can apply to any of the plurality of capacitor elements.

According to at least one further embodiment, a method for monitoring at least one capacitor element in an electrical system is specified. The description before and in the following equally applies to the electrical system with the at least one capacitor element and to the method for monitoring the at least one capacitor element in the electrical system.

According to a further embodiment, at least one parameter is measured, the at least one parameter being chosen from device parameters and environmental parameters. Furthermore, based on the at least one measured parameter a capacitor element information of the at least one capacitor element can be evaluated. Accordingly, the electrical system can comprise at least one sensor configured to measure at least one parameter chosen from device parameters and environmental parameters. Furthermore, the electrical system can comprise a processing unit configured to process the at least one parameter and to evaluate, based on the at least one parameter, a capacitor element information of the at least one capacitor element.

Here and in the following, a device parameter can be in particular a parameter that is directly related to the capacitor element or at least a component thereof and/or to the electrical system or at least a component thereof, while an environmental parameter can be a parameter for example of the atmosphere surrounding the capacitor element and/or surrounding the electrical system. A device parameter of a device can be an electrical parameter like, for example, an electrical voltage and/or an electrical current applied to said device, or a temperature of said device or of at least one component thereof. A sensor configured to measure a device parameter can be, for instance, a voltage sensor, a current sensor, a temperature sensor, and can be directly coupled to said device, for example by a mechanical contact or by an inductive coupling or by an optical coupling. An environmental parameter can be, for instance, a temperature of the atmosphere surrounding the capacitor element or the concentration of one or more gas species contained in the atmosphere surrounding the capacitor element or vibrations or mechanical shocks. A sensor configured to measure an environmental parameter can be, for instance, a temperature sensor or a gas sensor that can be preferably situated in the atmosphere surrounding the capacitor element or a vibration sensor situated in contact with a component of the electrical system.

The electrical system can be, for instance, a converter for converting an electrical signal, characterized by an electrical voltage, electrical current and/or a frequency, into another an electrical signal. For instance, the converter is configured to convert a high-voltage AC input signal with a certain frequency into an output signal having another voltage and/or a different frequency. Furthermore, the electrical system can be another electrical device containing at least one capacitor element.

According to a further embodiment, during operation of the electrical system and/or the at least one capacitor element the at least one parameter is measured in real-time and the capacitor element information is evaluated in real-time. Thus, the capacitor element information of the at least one capacitor element can be obtained during operation of the electrical system, and no shut-down, switching-off or other interference with the electrical system is necessary in order to obtain information about the at least one capacitor element. Furthermore, based on the capacitor element information an information can be provided for an operator of the electrical system. Preferably, the at least one parameter is measured continuously during operation of the electrical system. Furthermore, it can also be possible that the at least one parameter is measured continuously when the electrical system or at least parts thereof are powered down or even switched off. Performing a measurement continuously can in particular mean that the measurement is performed repeatedly, for instance at certain measurement time intervals, which are separated by non-measurement time intervals without performing the measurement, or even permanently, i.e., substantially or even completely uninterrupted by non-measurement time-intervals. For instance, the measurement of the at least one parameter can be performed every few minutes or every few seconds or every 2 seconds or every 1 second or every 100 ms or even at shorter time intervals or permanently. The same can apply similarly to the evaluation of the capacitor element information by the processing unit.

In particular, the electrical system and the method described herein can aim for one or more safety means that can be used alone or in combination to create an integral safety environment for the at least one capacitor element during operation. In particular, the one or more safety means can be implemented in the electrical system so that the electrical system can acquire data and further process and evaluate the data in order to obtain information about the at least one capacitor element. Based on the obtained information, for example a status report or an alarm can be generated in order to inform an operator about the status of the capacitor element and/or about measures that should be taken.

According to a further embodiment, the capacitor element information includes one or more conditions of the capacitor element that can be used to determine a current status of the capacitor element and/or possible actions to be taken, and can comprise, in particular, one or more chosen from a capacitance loss, a tangent variation, a stress, a remaining lifetime, a failure condition. In particular, the capacitor element information can be a momentary value or an evolution of a value over time. Thus, the capacitor element information can comprise one or more chosen from a momentary capacitance loss, a capacitance loss evolution over time, a momentary tangent variation, a tangent variation evolution over time, a momentary stress, a stress accumulated over time, a remaining lifetime, and a failure condition. The capacitance loss, tangent variation and/or stress can for example contribute to an ageing status of the capacitor element. In particular, stress can be caused by mechanical stress and/or electrical stress and/or temperature-induced stress. Temperature-induced stress can be caused by the temperature of the capacitor element or a component thereof and/or by the temperature of the environment. Electrical stress can be caused by the voltage and/or current applied to the capacitor element. Mechanical stress can be caused by vibrations and/or mechanical shocks applied directly to the capacitor element and/or indirectly via other components of the electrical system. A failure condition can be a condition of the capacitor element that can create a harmful and/or dangerous situation for the electrical system.

According to a further embodiment, the evaluation of the capacitor element information can be performed based on empirical models and/or simulations and/or determined thresholds. In particular, the evaluation can preferably be performed with the aid of mathematical formulas and/or algorithms based on empirical models and/or simulations and/or determined thresholds. The models, simulations and thresholds can be specifically adapted to the at least one capacitor element, so that for instance different mathematical formulas and/or algorithms are used for different capacitor elements. The processing unit can for example comprise or be a microprocessor or a personal computer.

The evaluated conditions in the form of the evaluated capacitor element information can be monitored and checked in real-time, for instance to ensure that the capacitor element fulfills the specification, i.e., is in a proper condition of operation, and/or to determine the ageing condition and/or to ensure that one can properly react on the evaluated condition if needed. In particular, the measured parameter(s) and/or the capacitor element information can be stored and can be used for monitoring and/or as basis for making decisions, for instance in regard to further using or exchanging the capacitor element.

According to a further embodiment, a plurality of parameters chosen from device parameters and environmental parameters is measured, wherein the parameters can be processed individually and/or in combination for evaluating the capacitor element information. Consequently, the at least one sensor of the electrical system can comprise or be a plurality of sensors configured to measure a plurality of parameters chosen from device parameters and environmental parameters.

According to a further embodiment, the at least one sensor comprises one or more sensors configured to measure an electrical condition of operation of the capacitor element and/or of the electrical system or of a component thereof. The electrical condition can be an operating voltage, preferably applied to the at least one capacitor element, and/or an operating current, preferably applied to the at least one capacitor element. Furthermore, the at least one sensor can comprise one or more sensors configured to measure a temperature of the at least one capacitor element or of a component thereof. In particular, the at least one sensor can comprise one or more sensors configured to measure at least one of a DC voltage, a DC current, a ripple voltage, and a temperature of a maximum temperature, which can also be denoted as a hot spot, of the at least one capacitor element or of a housing of the at least one capacitor element. In case the temperature of the housing of the at least one capacitor element is measured, the processing unit can be configured to estimate a hot spot temperature inside the housing of the at least one capacitor element, based on the measured temperature of the housing. For example, the temperature sensor can be a thermocouple mechanically or adhesively coupled to the housing of the capacitor element.

Particularly preferably, the electrical system comprises at least one first sensor configured to measure an electrical condition of operation of the capacitor element and/or of the electrical system and at least one further sensor configured to measure the temperature of the capacitor element. Additionally or alternatively, the at least one sensor preferably comprises one or more sensors configured to measure one or more of an environmental humidity, an environmental temperature, mechanical impacts like vibrations and mechanical shocks, one or more gas species. Accordingly, the environmental parameters can be chosen from an environmental humidity, an environmental temperature, vibrations, one or more gas species.

In particular, the one or more gas species can be chosen from a gas species that can be created during a pyrolysis event of one or more components of the capacitor element. The pyrolysis event is an example for a failure condition of the capacitor element that can create a potential risk for damaging the electrical system. The gas species measurement can also be denoted as pollution measurement, by means of which the pollution in regard to a potentially harmful gas species in the electrical system can be determined. As explained above, the capacitor element can be a film capacitor comprising a polymer film or another capacitor containing a polymer component that can be pyrolized in the event of a too high temperature inside the capacitor element's housing. Due to the pyrolysis event, one or more inflammable gas species can be produced. For example, the polymer can comprise or be polypropylene (PP), which can be decomposed into propylene, methane, propane etc.

Alternatively or additionally, the polymer film can comprise or be made of one or more chosen from polyethylene terephthalate polyester (PET), polyphenylene sulfide (PPS), polyethylene naphthalate (PEN), polycarbonate (PP), polystyrene (PS) and polytetrafluoroethylene (PTFE). In case a leakage is present in the housing, the decomposition gases can escape the housing and can, if a certain concentration in the environment is reached, lead to an explosion. Based on the gas measurement the concentration can be monitored and, in case the concentration level approaches or reaches the low flammability level (LFL), a warning or an alarm can be generated.

In the following, particularly preferred aspects are listed in regard to the features and embodiments described before:

Aspect 1: An electrical system, comprising
at least one capacitor element,
at least one sensor configured to measure at least one parameter chosen from device parameters (D) and environmental parameters (E), and
a processing unit configured to process the at least one parameter and to evaluate a capacitor element information (CEI) of the at least one capacitor element based on the at least one parameter,
wherein the capacitor element information comprises one or more chosen from a capacitance loss, a tangent variation, a stress, a remaining lifetime, a failure condition.

Aspect 2: The electrical system according to aspect 1, wherein the electrical system comprises a plurality of sensors configured to measure a plurality of parameters chosen from device parameters and environmental parameters.

Aspect 3: The electrical system according to aspect 1 or 2, wherein the at least one sensor comprises one or more sensors configured to measure an electrical condition of operation of the capacitor element and/or the electrical system.

Aspect 4: The electrical system according to one of aspects 1 to 3, wherein the at least one sensor comprises one or more sensors configured to measure at least one of a DC voltage, a DC current, a ripple voltage, and a temperature at a hot spot of the at least one capacitor element or of a housing of the at least one capacitor element.

Aspect 5: The electrical system according to aspect 4, wherein the processing unit is configured to estimate a maximum temperature inside the housing of the at least one capacitor element based on the measured temperature of the housing.

Aspect 6: The electrical system according to one of aspects 1 to 5, wherein the at least one sensor comprises one or more sensors configured to measure an environmental humidity, an environmental temperature, vibrations, one or more gas species.

Aspect 7: The electrical system according to aspect 6, wherein the one or more gas species are chosen from a gas species that can be created during a pyrolysis event of one or more components of the capacitor element.

Aspect 8: The electrical system according to one of aspects 1 to 7, wherein the capacitor element is a film capacitor comprising a polymer film.

Aspect 9: The electrical system according to one of aspects 1 to 8, wherein the processing unit comprises a microprocessor and/or a personal computer.

Aspect 10: A method for monitoring at least one capacitor element in an electrical system as described in one of aspects 1 to 9, wherein
at least one parameter is measured, the at least one parameter being chosen from device parameters and environmental parameters,
a capacitor element information of the at least one capacitor element is evaluated based on the at least one parameter.

Aspect 11: The method according to aspect 10, wherein, during operation of the electrical system and/or the at least one capacitor element, the at least one parameter is measured in real-time and the capacitor element information is evaluated in real-time.

Aspect 12: The method according to aspect 10 or 11, wherein, based on the capacitor element information, an information is provided for an operator of the electrical system.

BRIEF DESCRIPTION OF THE DRAWINGS

Further advantages, advantageous embodiments and further developments are revealed by the embodiments described below in connection with the figures, in which.

DETAILED DESCRIPTION

Figure 1A:
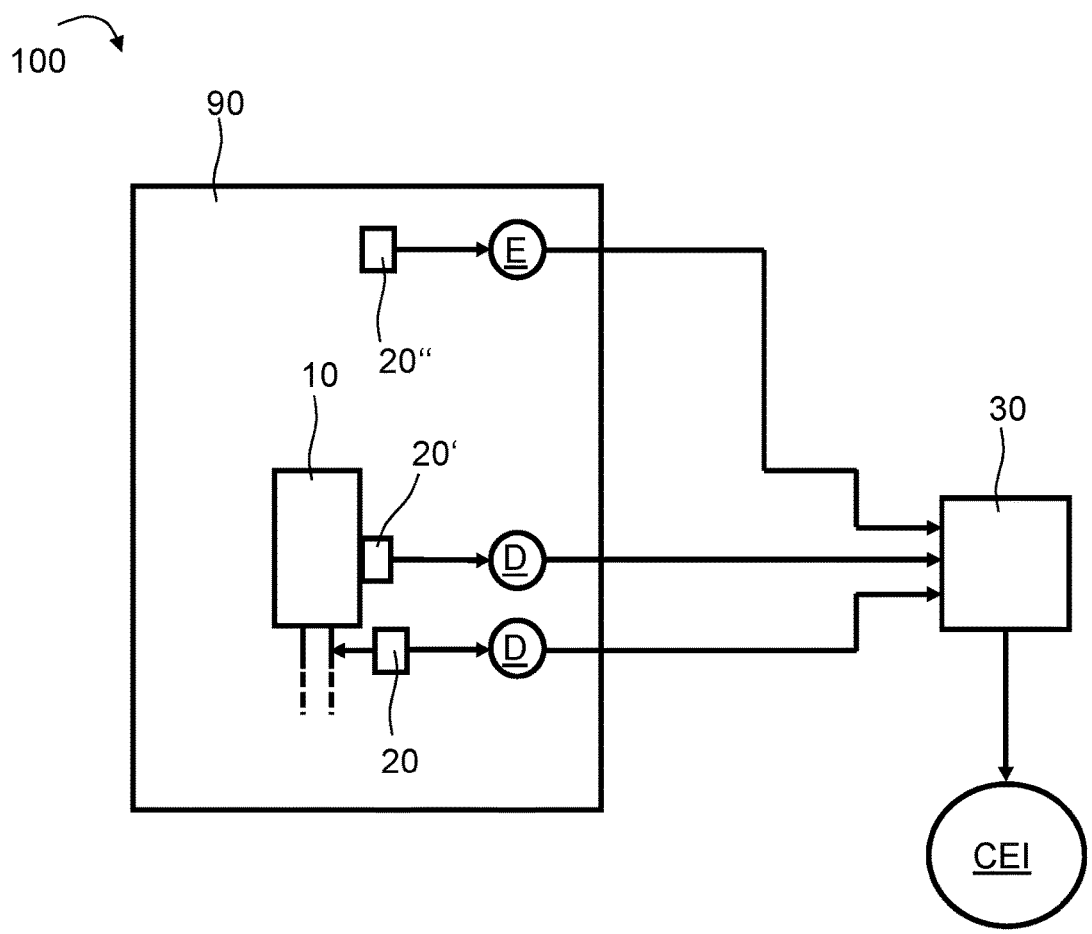
FIGS. 1A and 1B show schematic illustrations of an electrical system with at least one capacitor element and a method for monitoring the at least one capacitor element in an electrical system according to several embodiment.

In the embodiments and FIGURES, identical, similar or identically acting elements are provided in each case with the same reference numerals. The elements illustrated and their size ratios to one another should not be regarded as being to scale, but rather individual elements, such as for example layers, components, devices and regions, may have been made exaggeratedly large to illustrate them better and/or to aid comprehension.

Figure 1B:
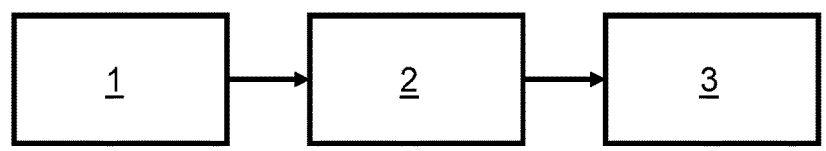

FIG. 1A shows an electrical system 100 comprising at least one capacitor element 10. FIG. 1B shows a method for monitoring the at least one capacitor element 10 in the electrical system. The following description equally applies to FIGS. 1A and 1B.

Although the electrical system 100 is shown with exactly one capacitor element 10, the electrical system 100 can comprise more than one capacitor element 10. The following description of features and embodiments in regard to the shown one capacitor element 10 can therefore similarly apply to any of a plurality of capacitor elements in the electrical system 100. By way of example, the electrical system 100 can comprise or be a converter as explained in the general part. Alternatively, the electrical system can be any other electrical device that includes at least one capacitor element. The at least one capacitor element 10 can be, for instance, a film capacitor comprising one or more electrode layers separated by a polymer material, for instance comprising or made of polypropylene. Alternatively or additionally, also other types of capacitor elements are possible.

The electrical system 100 further comprises a system room 90, in which the at least one capacitor element 10 is situated. In particular, the system room 90 can house further or even all electrical and electronic components of the electrical system 100 and can also be denoted as chamber. Furthermore, the electrical system comprises one or more sensors 20, 20', 20". Only by way of example, three sensors 20, 20', 20" are shown in FIG. 1A. However, less or more than the shown three sensors are also possible. Depending on the respective type of sensor, each of the sensors 20, 20', 20" is configured to measure, in a method step 1 as indicated in FIG. 1B, at least one parameter chosen from device parameters D and environmental parameters E.

Moreover, in a method step 2 as indicated in FIG. 1B, the electrical system 100 comprises a processing unit 30 configured to process the one or more parameters D, E and to evaluate a capacitor element information CEI of the at least one capacitor element 10 based on the at least one parameter D, E. The processing unit 30 can comprise or can be, for instance, a microprocessor or a personal computer. Although the processing unit 30 is shown outside the system room 90 in FIG. 1A, the processing unit 30 or at least parts thereof can also be situated inside the system room 90.

By performing one or more evaluations, the processing unit 30 can provide a capacitor element information CEI, wherein the capacitor element information CEI comprises one or more chosen from a capacitance loss, a tangent variation, a stress, a remaining lifetime, a failure condition as explained in the general part.

During operation of the electrical system 100 and/or the at least one capacitor element 10 the at least one parameter D, E can be measured in method step 1 in real-time and the capacitor element information CEI can be evaluated in real-time in method step 2. Furthermore, based on the capacitor element information CEI an information can be provided for an operator of the electrical system, which is indicated as method step 3 in FIG. 1B. Method step 3 can also include monitoring and/or storing the CEI and/or the one or more measured parameters D, E. Preferably, the at least one parameter D, E is measured continuously during operation of the electrical system as explained in the general part. Furthermore, it can also be possible that the at least one parameter D, E is measured continuously when the electrical system 100 or at least parts thereof are powered down or even switched off.

The sensors 20, 20', 20" can be configured to measure one or more of the following device parameters D and environmental parameters E: An electrical condition of operation of the capacitor element 10 and/or the electrical system 100 or of a component thereof can be measured, as indicated by the exemplary sensor 20 in FIG. 1A. The electrical condition can be an operating voltage, preferably applied to the at least one capacitor element 10, and/or an operating current, preferably applied to the at least one capacitor element 10. Furthermore, a temperature of the at least one capacitor element 10 can be measured, as indicated by the exemplary sensor 20' in FIG. 1A. Consequently, the electrical system 100 can comprise one or more sensors configured to measure at least one of a DC voltage, a DC current, a ripple voltage, and a temperature at a hot spot of the at least one capacitor element or of a housing of the at least one capacitor element. In case the temperature of the housing of the at least one capacitor element is measured, as indicated in FIG. 1A, the processing unit 30 can be configured to estimate a maximum temperature inside the housing of the at least one capacitor element, which can also be denoted as a hot spot, based on the measured temperature of the housing. For example, the temperature sensor 20' can be a thermocouple fixed to the housing of the capacitor element 10.

Furthermore, one or more of an environmental humidity, an environmental temperature, mechanical impacts like vibrations and mechanical shocks, one or more gas species can be measured, as indicated by the exemplary sensor 20" in FIG. 1A. Accordingly, the environmental parameters E can be chosen for instance from an environmental humidity, an environmental temperature, vibrations, one or more gas species.

In the following, preferred aspects of the electrical system and the method, which include preferred safety means and methods for operating the electrical system and the capacitor element, are described. All aspects can be implemented individually or can be combined with each other, thereby combining multiple safety means and method in the electrical system 100. Furthermore all aspects can be combined with the features and embodiments described in the general part.

Aspect 1: The method uses the data of one or several different sensors, e.g., chosen from sensors measuring one or more of temperature, electrical properties, vibrations, humidity, pollution etc., which is acquired as real time data from the system room and/or the capacitor. This data is processed by the processing unit, i.e., a microprocessor or personal computer, and different calculations such as capacitance loss evolution, tangent variation evolution, stress, remaining lifetime etc. are performed based on algorithms and mathematical formulas and models. Conditions of operation are monitored and checked in real time to ensure that the capacitor fulfills the specifications and that measures can be taken if needed.

Aspect 2: Related and in addition to aspect 1, the method further comprises the real-time sensing of electrical conditions of the electrical system and/or capacitor and the temperature on or in the housing or of a hotspot of the capacitor. With the acquired data, the system can be capable of calculating the instantaneous stress and, with the history of stresses, can be able to calculate the previous capacitance losses versus time and to estimate the capacitance losses versus time in the future. With this data, the remaining lifetime can be calculated as well.

Aspect 3: Related and in addition to aspect 1, the method further comprises the real-time sensing of one or more parameters of the electrical system's and/or system room's and/or capacitor's surrounding environment, for instance one or more of humidity, temperature, vibrations etc. With the acquired data, conditions can be checked to find situations that can affect the electrical system and/or the capacitor negatively. An algorithm receives these data as inputs, interprets them and, according to certain thresholds and rules, can generate an alarm with detailed information.

Aspect 4: Related and in addition to claim 1, the method further comprises the real-time sensing of a pollution in the system room, so that a gas leakage from one or more of the one or more capacitors can be detected. The change in pollution can be caused by an increase of the concentration of gases that are created during a pyrolysis of the polymer, e.g., polypropylene, of the capacitor element, which can create one or more gas species like propylene, methane, propane etc., which are flammable even at low concentrations. The values can be stored and can be used for monitoring and/or for generating an alarm in case the level of gases is close to the low flammability level (LFL).

Aspect 5: The electrical system comprises a set of sensors of different types, e.g., sensors for measuring temperature, electrical parameters, vibrations, humidity, pollution etc., which acquire real-time data from the system room and/or the capacitor. This data is processed by the processing unit, i.e., a microprocessor or personal computer, and different calculations such as capacitance loss evolution, tangent variation evolution, stress, remaining lifetime etc. are performed based on algorithms and mathematical formulas and models. Conditions of operation are monitored and checked in real time to ensure that the capacitor fulfills the specifications and that measures can be taken if needed.

Aspect 6: Related and in addition to aspect 5, the electrical system comprises at least one sensor that measures the electrical conditions of operation of the electrical system and/or capacitor in real time and at least one sensor measures the temperature on or in the housing or of a hotspot of the capacitor in real time. The acquired data is received by the processing unit and, based on algorithms and mathematical formulas and models, capacitance loss, tangent variation, stress and/or the remaining lifetime is calculated. These values can be stored and can be used for monitoring and/or as a basis for making decisions.

Aspect 7: Related and in addition to aspect 5, the electrical system comprises at least one sensor that measures the environmental conditions of operation of the electrical system's and/or the system room's and/or the capacitor's surroundings, e.g., room temperature, humidity, vibrations etc., in real time. The acquired data is received by the processing unit and, based on algorithms and thresholds, environmental conditions are checked to determine if the capacitor can fulfill the conditions and to determine the already caused ageing. The values can be stored and can be used for monitoring and/or as a basis for making decisions.

Aspect 8: Related and in addition to aspect 5, the electrical system comprises at least one sensor that measures the pollution of the system room in real time. The acquired data is received by the processing unit and, based on algorithms and thresholds, the level of gases is checked to find out if the capacitor is leaking gases through the housing, which indicates internal failure. The values are stored and can be used for monitoring and/or as an alarm if the level of gases is close to the low flammability level (LFL).

As a consequence of aspects 2 and 6, unexpected higher stresses can be detected and measured with accuracy. This translates into a capacitance loss and a shortening of the lifetime. If the expected lifetime is lower than specified, early measures can be taken to replace the capacitor or redesign it. If the stress is lower than expected, another capacitor can be selected for the application so that cost and room is reduced.

As a consequence of aspects 3 and 7, the conditions and their effect on the capacitor are detected prematurely, thereby allowing to take measures and avoiding further damage.

As a consequence of aspects 4 and 8, a gas leakage can be detected before reaching the low flammability level (LFL) concentration, thereby avoiding a catastrophic situation.

According to aspects 2 and 6, electrical and/or thermal measures are monitored and used to calculate the stress, capacitance loss and lifetime and their variations in real time continuously. Up to today, capacitance and loss factor are measured manually during maintenance.

According to aspects 3 and 7, environmental conditions can be detected early enough so that measures can be taken to change them or to alleviate their effect. Up to today, these conditions are not usually checked in real time, for instance in converters, and, therefore, their effect on the capacitors is not taken into account.

According to aspects 4 and 8, a gas leakage can be detected before reaching the low flammability level in the system room, thereby avoiding a catastrophic situation. Up to today, harmful gases are not controlled and have caused explosions.

Alternatively or additionally to the features described in connection with the FIGURES, the embodiments shown in the FIGURES can comprise further features described in the general part of the description. Moreover, features and embodiments of the FIGURES can be combined with each other, even if such combination is not explicitly described.

The invention is not restricted by the description on the basis of the exemplary embodiments. Rather, the invention encompasses any new feature and also any combination of features, which in particular comprises any combination of features in the patent claims, even if this feature or this combination itself is not explicitly specified in the patent claims or exemplary embodiments.

The invention claimed is:

1. An electrical system, comprising:
   at least one capacitor element;
   at least one sensor configured to measure at least one parameter chosen from device parameters and environmental parameters; and
   a processing unit configured to process the at least one parameter and to evaluate a capacitor element information of the at least one capacitor element based on the at least one parameter,
   wherein the capacitor element information comprises one or more chosen from a capacitance loss, a tangent variation, a stress, a remaining lifetime, a failure condition,
   wherein the at least one sensor comprises one or more sensors configured to perform a pollution measurement where pollution in regard to one or more gas species that are chosen from a gas species created during a pyrolysis event of one or more components of the capacitor element is measured.

2. The electrical system according to claim 1, wherein the capacitor element is a film capacitor comprising a polymer film.

3. The electrical system according to claim 2, wherein the one or more gas species comprise one or more inflammable gas species produced due to a decomposition of the polymer film.

4. The electrical system according to claim 1, wherein the electrical system comprises a plurality of sensors configured to measure a plurality of parameters chosen from device parameters and environmental parameters.

5. The electrical system according to claim 1, wherein the at least one sensor comprises one or more sensors configured to measure an electrical condition of operation of the capacitor element and/or the electrical system.

6. The electrical system according to claim 1, wherein the at least one sensor comprises one or more sensors configured to measure at least one of a DC voltage, a DC current, a ripple voltage, and a temperature at a hot spot of the at least one capacitor element or of a housing of the at least one capacitor element.

7. The electrical system according to claim 4, wherein the processing unit is configured to estimate a maximum temperature inside the housing of the at least one capacitor element based on the measured temperature of the housing.

8. The electrical system according to claim 1, wherein the at least one sensor comprises one or more sensors configured to measure an environmental humidity, an environmental temperature, vibrations.

9. The electrical system according to claim 1, wherein the processing unit comprises a microprocessor and/or a personal computer.

10. A method for monitoring at least one capacitor element in an electrical system as claimed in claim 1, wherein at least one parameter is measured, the at least one parameter being chosen from device parameters and environmental parameters, and a capacitor element information of the at least one capacitor element is evaluated based on the at least one parameter.

11. The method according to claim 10, wherein, during operation of the electrical system and/or the at least one capacitor element, the at least one parameter is measured in real-time and the capacitor element information is evaluated in real-time.

12. The method according to claim 10, wherein, based on the capacitor element information, an information is provided for an operator of the electrical system.

13. The method according to claim 10, wherein the at least one parameter that is measured comprises one or more gas species that are chosen from gas species created during a pyrolysis event of one or more components of the capacitor element.

\* \* \* \* \*